United States Patent
Hajimiri

(10) Patent No.: US 11,853,850 B2
(45) Date of Patent: Dec. 26, 2023

(54) ARRAYS FOR QUANTUM WAVEFUNCTION MANIPULATION

(71) Applicant: California Institute of Technology, Pasadena, CA (US)

(72) Inventor: Seyed Ali Hajimiri, La Canada, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 0 days.

(21) Appl. No.: 17/858,763

(22) Filed: Jul. 6, 2022

(65) Prior Publication Data

US 2023/0015084 A1    Jan. 19, 2023

Related U.S. Application Data

(60) Provisional application No. 63/218,768, filed on Jul. 6, 2021.

(51) Int. Cl.
| | |
|---|---|
| *G06N 10/40* | (2022.01) |
| *G02F 1/21* | (2006.01) |
| *H05K 1/16* | (2006.01) |
| *G02F 1/09* | (2006.01) |
| *H05K 1/11* | (2006.01) |

(52) U.S. Cl.
CPC ............ *G06N 10/40* (2022.01); *G02F 1/09* (2013.01); *G02F 1/21* (2013.01); *H05K 1/115* (2013.01); *H05K 1/165* (2013.01); *G02F 2201/305* (2013.01)

(58) Field of Classification Search
CPC .. G06N 10/40; G02F 1/09; G02F 1/21; G02F 2201/305; H05K 1/115; H05K 1/165; H05K 2201/09409
See application file for complete search history.

(56) References Cited

U.S. PATENT DOCUMENTS

| | | | | |
|---|---|---|---|---|
| 5,091,980 A | * | 2/1992 | Ogawa ................. | G02F 1/3517 708/190 |
| 2020/0303534 A1 | * | 9/2020 | Ram ................... | H01L 29/7786 |

OTHER PUBLICATIONS

Tonomura, A., et al., "Evidence for Aharonov-Bohm Effect with Magnetic Field Completely Shielded from Electron wave", Physical Review Letters, Feb. 24, 1986, pp. 792-801, vol. 56, No. 8.
Tonomura, A., et al., "Demonstration of single-electron buildup of an interference pattern", Am. J. Phys., Feb. 1989, pp. 117-120, vol. 57, No. 2.

* cited by examiner

*Primary Examiner* — Seung C Sohn
(74) *Attorney, Agent, or Firm* — GATES & COOPER LLP

(57) ABSTRACT

A quantum phased array comprising one or more arrays of emitter elements each emitting one or more particles having one or more quantum wavefunctions; one or more a phase shifting elements coupled to the emitter elements, each of the phase shifting elements comprising a source of a vector potential applying one or more phase shifts to the one or more quantum wavefunctions; and a control circuit coupled to the one or more phase shifting elements, the control circuit configuring the one or more vector potentials to control an interference of the quantum wavefunctions forming a distribution of the one or more particles at a target, and wherein the distribution is described by a wavefunction interference pattern resulting from the interference controlled by the vector potentials.

21 Claims, 14 Drawing Sheets

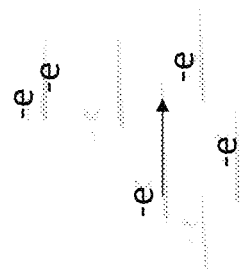
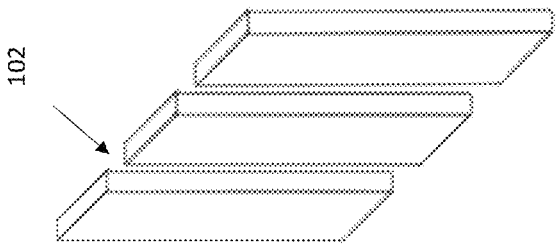
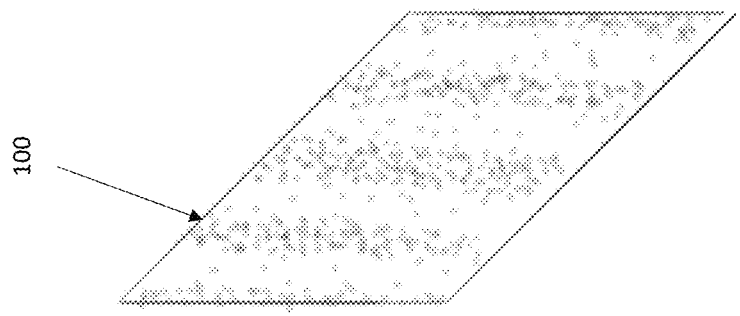
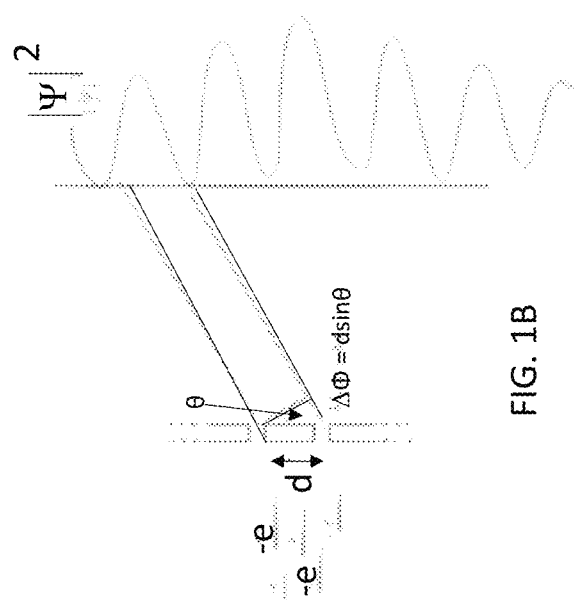
FIG. 1A
FIG. 1B

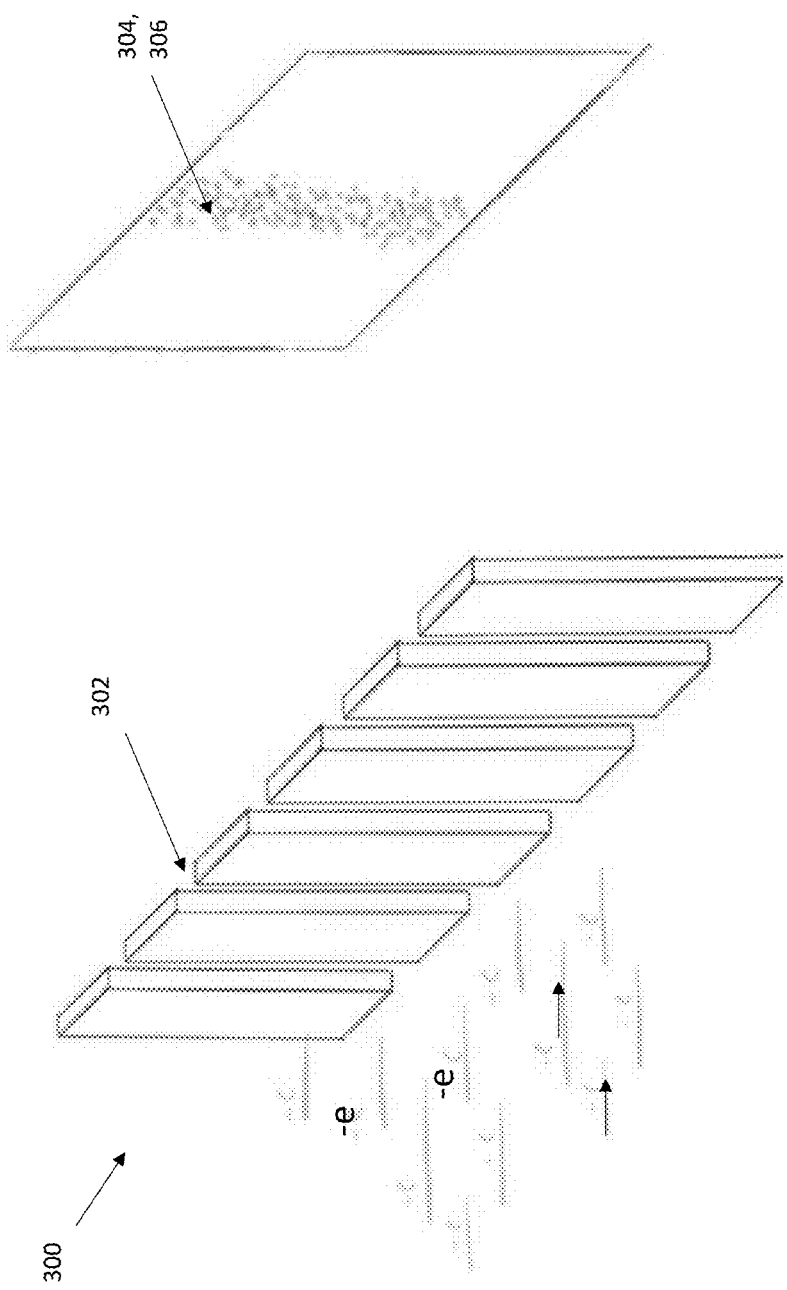

ARRAYS FOR QUANTUM WAVEFUNCTION MANIPULATION

CROSS REFERENCE TO RELATED APPLICATIONS

This application claims the benefit under 35 USC 119(e) of commonly assigned U.S. Provisional Patent Application Ser. No. 63/218,768, filed Jul. 6, 2021, by Seyed Ali Hajimiri, entitled "Arrays For Quantum Wavefunction Manipulation," which application is incorporated by reference herein.

BACKGROUND OF THE INVENTION

1. Field of the Invention

The present invention relates to phased arrays for quantum wavefunction manipulation.

2. Description of the Related Art

Waveform manipulation of electromagnetic waveforms using arrays of elements that manipulate the phase and/or amplitude of components of waveforms have been used in devices such as radio frequency (RF) and optical phased arrays to create various waveforms with beam-forming, focusing, and other spatial/temporal patterns.

In quantum mechanics, the behavior of various particles can be described by the state vector that is described by the Schrödinger equation in the non-relativistic view, $$i\hbar \partial_t |\Psi\rangle = -\frac{\hbar^2 \partial_i^2}{2m}|\Psi\rangle + V(\hat{x})|\Psi\rangle \quad (1)$$

where V(x) is the potential energy operator and h is the reduced Planck's constant. For Fermions (spin of ½) Dirac equation that includes the special relativistic effects, can be expressed as:

$$i\partial_\mu \gamma^\mu \Psi - m\Psi = 0 \quad (2)$$

where $\partial_\mu$ is the partial derivative with respect to one of the 4-dimensional time-space coordinates, $\gamma^\mu$ are 4×4 matrixes which can be represented in various basis (e.g., chiral basis), and $\Psi$ is the Dirac spinor, and m is the mass.

The state vector in the Schrödinger equation projected onto the position eigenstates produces the wave function, $\psi(x)$, i.e., $$|\Psi\rangle = \int dx \psi(x) |x\rangle \quad (3)$$

FIG. 1 illustrates a canonical experiment demonstrating the basic quantum mechanical behavior of electrons −e (or other particles), in the dual slit experiment, where electrons emitted with a narrow range of De Broglie wavelengths (for particle with momentum p given by $$\lambda = \frac{h}{p} \quad (4)$$

produce an associated interference pattern 100 behind the screen, based on the constructive or destructive summation of quantum mechanical wavefunctions at different locations, determined by the path length difference from the two slits 102 and determined by the slit separation d. This pattern is observable even when the electrons are transmitted individually and one at a time [1] [2], proving the true wave nature of the particles.

What is needed, however, are methods and systems which apply these principles in practical applications. The present disclosure satisfies this need.

SUMMARY OF THE INVENTION

The present invention is directed to arrays and arrays of arrays that locally manipulate one or more local properties (such as, but not limited to, vector potential $\vec{A}(\vec{r})$ as a function of the three-dimensional location capture by vector, $\vec{r}$) to induce phase and/or amplitude shifts in the quantum wavefunction(s), $\psi(x)$, of the particles interacting with the local properties. The quantum wavefunction(s) comprise complex wavefront(s) and the manipulation of the phase and/or amplitude results in the quantum wavefunction(s) performing complex functions such as, but not limited to, computation, imaging, scanning, and information transfer.

Example devices and systems according to embodiments of the present invention include, but are not limited to, the following.

1. A quantum phased array, comprising:
   one or more arrays of elements inputting or outputting (e.g., emitting, transmitting, coupling, or channeling) one or more particles having one or more quantum wavefunctions (example elements include, but are not limited to, apertures, holes or openings (e.g., slit or slots), or windows);
   one or more a modulator elements coupled to the emitter elements, each of the modulator elements or gating devices comprising a source of a vector potential applying one or more phase and/or amplitude shifts to the one or more quantum wavefunctions (example modulators include, but are not limited to, coils (e.g., toroids or solenoids); and
   a control circuit coupled to the one or more modulator elements, the control circuit configuring the one or more local vector potentials to control an interference of the quantum wavefunctions forming a distribution of the one or more particles at a target, and wherein the distribution is described by a wavefunction interference pattern resulting from the interference controlled by the vector potentials.

2. The phased array of example 1, wherein the arrays comprise one or more n layers of the emitter elements coupled and aligned such that the particles outputted from the $j^{th}$ layer are incident on the $(j+1)^{th}$ layer, where $1 \leq j \leq n$.

3. The phased array of example 2, further comprising:
   one or more array(s) of particle detector emitter elements positioned at the target and outputting one or more signals in response to detection of the one or more particles at the particle detector pixels;
   a collecting circuit collecting and processing the signals received from the detectors; and
   a computer coupled to the array of particle detector pixels and the control circuit, the computer performing one or more computations using the collected signals; and wherein:
   the computer outputs one or more control signals to the control circuit in response to the computations; and
   the control circuit uses the one or more control signals as feedback to configure the vector potentials.

4. A quantum computer comprising the phased array of example 3 and further comprising a transmitter transmitting one or more particles to the phased array with one or more energies and one or more timings, wherein the quantum computer performs a quantum algorithm using the collected signals, the timings, the control signals, and the energies as inputs or parameters and the signals from the detectors as outputs or parameters.

5. A quantum computer comprising the phased array of example 4, further comprising a plurality of layers of the arrays and a medium between at least two of the layers, the medium mediating an interaction of the states of two particles transitioning together through the quantum computer, wherein the control circuit adjusts the vector potentials so as to adjust at least one of a degree of superposition, entanglement or mixing of the states.

6. The quantum computer of example 5, wherein adjustment of the vector potentials adjusts the quantum wavefunctions of the two particles so as to focus the particles into the same spatio-temporal coordinates to maximize their interactions and manipulate their state vectors.

7. A quantum detector or metrology system comprising the phased array of example 2, and further comprising:
a transmitter transmitting one or more particles to the phased array with one or more energies and one or more timings and one or more spatial and spin orientations,
a first set of the one or more layers of the emitter elements forming the distribution of the one or more particles at the target comprising a first target;
a second set of the one or more layers of the emitter elements positioned to receive the one or more particles, comprising one or more output particles that have interacted with a sample positioned at the first target, the second set forming the distribution of the output particles at the target comprising a second target; and
a detection system coupled to the second set, the detection system comprising:
an array of particle detector pixels positioned at the second target and outputting one or more signals in response to detection of the one or more output particles at the particle detector pixels;
a collection circuit aggregating the signals to form one or many collected signal; and
at least one of a computer or a detection circuit coupled to the array of particle detector pixels, the computer or detection circuit using the aggregated signal and optionally at least one of the timings or the energies to measure one or more quantum mechanical properties of the sample.

8. The quantum detector of example 7, further comprising the computer performing one or more computations using the aggregated signal; and wherein:
the computer outputs one or more control signals to the control circuit in at least the first set or the second set and in response to the computations; and
the control circuit uses the one or more control signals as feedback to configure the vector potentials for a measurement of the quantum mechanical properties.

9. A scanning quantum imaging or transmission quantum imaging comprising the quantum detector of example 7.

10. The phased array of example 2, wherein each of the one or more layers comprises a thin-film (less than a millimeter) printed circuit board comprising one of the arrays of the emitter elements comprising a two dimensional array, the emitter elements each comprising a through hole in the thin-film printed circuit board and one of the modulator elements comprising an electrical coil coupled to the through hole.

11. The phased array of example 10, wherein the printed circuit board comprises:
a dielectric material between a first metallized surface and a second metallized surface, and
the electrical coil comprises a toroid comprising a conductive track around a perimeter of the through hole, the conductive track comprising:
a plurality of first sections of the first metallized surface;
a plurality of second sections of the second metallized surface;
electrical connections between the first sections and the second sections passing through vias through a thickness of the dielectric material and positioned around the perimeter, so as to form the toroid around the through hole and comprising the first sections, the second sections, and the electrical connections.

12. The phased array of example 11, wherein the printed circuit board comprises a plurality of pins and tracks positioned for:
individually addressing each of the electrical coils and connecting to the control circuit via an electrical bus, the pins receiving signals from the control circuit for controlling the vector potentials by controlling a current through each of the electrical coils.

13. The phased array of any of the examples, wherein:
the emitter elements each comprise a diffracting element dimensioned to emit the particles by diffracting the one or more particles incident on the diffracting element,
the diffracting elements are spaced so as to form the interference of the quantum wavefunctions associated with the one or more particles emitted from different ones of the emitter elements, and
the modulator elements are positioned between the diffracting elements.

14. The phased array of example 13, wherein:
the diffracting element comprises an opening, slot, slit, or through hole having a size commensurate with a de Broglie wavelength of the particles incident on the opening,
and the de Broglie wavelength is determined from one or more energies of the particles incident on the diffracting element.

15. The phased array of example 13, wherein:
the particles are charged particles,
the modulator elements comprise electrical coils carrying a current configured so that a magnetic field inside the coil is zero or sufficiently small so that trajectories of the charged particles are determined by the vector potentials rather than deflection of the particles by the magnetic field, and
a longitudinal axis of the coil is across a cross-section of the diffracting element so that the vector potential has a component in a direction across the diffracting element.

16. The phased array of any of the examples, wherein the emitter elements are aligned and dimensioned, and the vector potentials are configured, so as to form at least one of a pre-determined spatial or temporal distribution of the particles at the target associated with the wavefunction interference pattern.

17. The phased array of any of the examples, wherein the emitter elements are aligned and dimensioned, and the vector potentials are configured, so as to form the wavefunction interference pattern associated shaping a beam of the particles incident on the target.
18. The phased array of any of the examples, wherein the control circuit dynamically varies the vector potentials so as to steer a beam of the particles.
19. The phased array of any of the examples, wherein the emitter elements are dimensioned and aligned, and the vector potentials are configured, so as to form the particles comprising entangled particles at the target.
20. An imaging system, detection system, communications system, or quantum computer comprising the phased array of any of the examples, wherein the particles comprise charged particles (e.g., electrons, protons, positrons), uncharged particles (e.g., neutrons), photons, plasmons, or phonons.
21. The array of any of the examples, wherein the quantum mechanical waveform describes a charge distribution or spin distribution of the particles.
22. The phased array of any of the examples, wherein: the detector comprises an array of detectors (e.g., avalanche photo diodes (APD), photomultiplier tubes (PMT), PIN diode) arranged in 1D, 2D, or 3D arrays.
21. A device comprising one or more thin film printed circuit boards each comprising an array (2D or 1D) of particle input ports or nodes (e.g., holes or apertures) coupled or integrated with a gating device (e.g., a toroid or solenoid), wherein dimensions and current passing through each of the coils are configured to output a vector potential or other local property modulating at least one of a phase or amplitude of a quantum wavefunction of the particles transmitted along a network of particle trajectories connected by the ports or nodes.
22. The device of example 21, wherein each of the toroids are embedded in the dielectric material of the printed circuit so that a hole of the toroid comprises one of the apertures or holes in the dielectric material.
23. The device of example 21, wherein each of the solenoids is attached to the printed circuit board between two of the holes or apertures.
24. The one or more printed circuit boards of any of the examples 21-23, each comprising an integrated circuit including the toroids or solenoids coupled to metal traces connected to pins and connectors for connecting to an electronic bus.
25. A stack of the printed circuit boards of any of the examples 21-23 mounted in parallel on a rack so that the particles are transmitted between parallel surfaces of the boards.
26. A computer, interferometer, or imaging device comprising the stack or example 25.
27. The system or quantum phased array of any of the examples, wherein a single particle (e.g., electron) is incident on the phased array, or layers of phased arrays, and the interference results from interference of the quantum wavefunction comprising a single particle wavefunction.
28. The system or quantum phased array of any of the examples, wherein the vector potentials (comprising magnetic vector potentials) experienced by the particles comprising electrons are modulated via the Ehrenberg-Siday-Aharonov-Bohm (ESAB) effect and the magnetic vector potentials are controlled by modulating current through a coil. In some embodiments, the magnetic vector potential is related to the magnetic field via $\nabla \times A = B$ and the phase shift is $\Delta\Phi$ proportional to $\oint A \cdot dl$ around a loop where dl is an elemental length of on the loop.
29. The quantum phased array of any of the examples 1-28, further comprising a detector array comprising a spatial array of detector pixels coupled to the array of elements emitting the one or more particles, wherein the detector pixels each detect a probability of arrival of the one or more particles (as a number of detection events per second) and output a read out signal comprising the probability of arrival on the detector pixel.
30. The quantum phased array of example 29, wherein the control circuit changes or adjusts a magnitude of the vector potentials in response to the read outs (or readout signals) of the probabilities of the arrival received from the detector array.

BRIEF DESCRIPTION OF THE DRAWINGS

Referring now to the drawings in which like reference numbers represent corresponding parts throughout:

FIGS. 1A-1B. Dual slit experiment with electrons showing interference patterns due to constructive and destructive interference of quantum wavefunctions determining the density of the electrons at each location, wherein FIG. 1A is a perspective view and FIG. 1B is a side view.

FIGS. 2A-2B. Phase shift between the phase of the quantum mechanical wavefunction due to magnetic vector potential (ESAB effect), wherein FIG. 2A is a perspective view and FIG. 2B is a side view.

FIG. 3. Multi slit electron diffraction pattern, where constructive interference occurs at the broadside.

DETAILED DESCRIPTION OF THE INVENTION

Figures 2A, 2B:
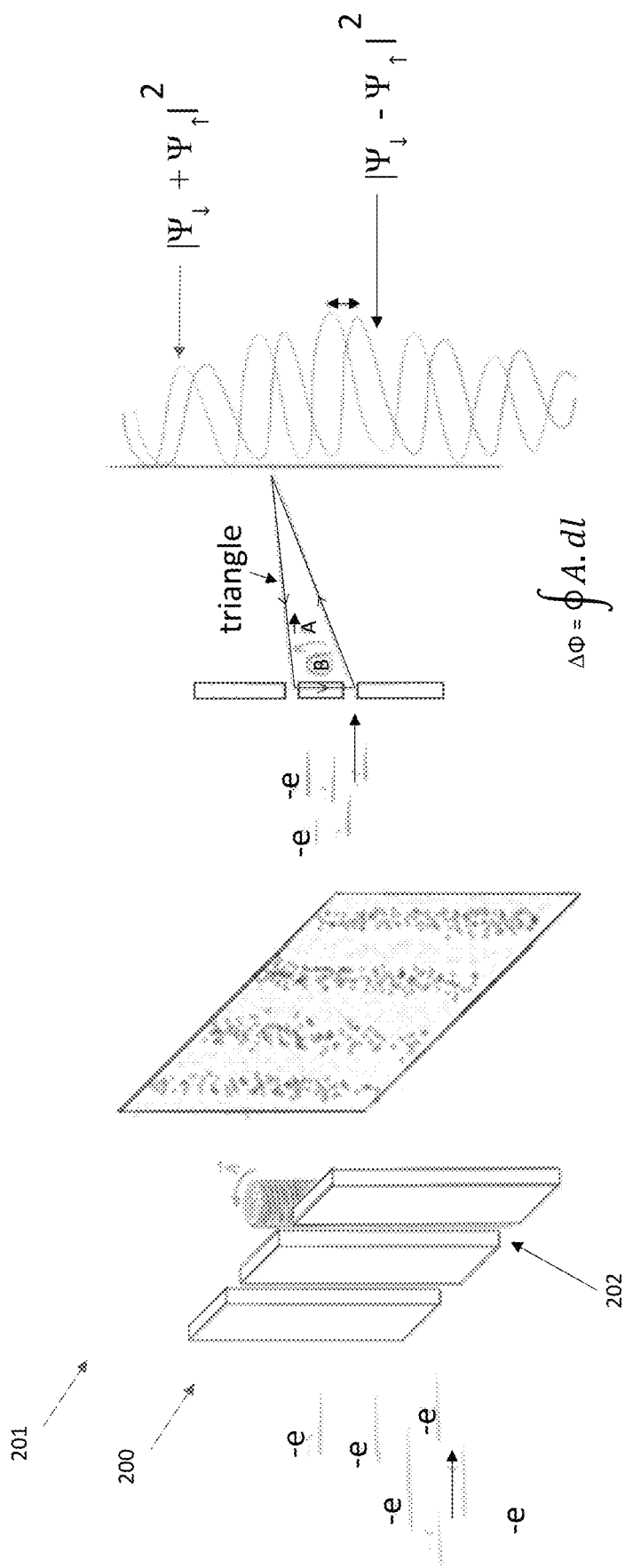

In the following description of the preferred embodiment, reference is made to the accompanying drawings which form a part hereof, and in which is shown by way of illustration a specific embodiment in which the invention may be practiced. It is to be understood that other embodiments may be utilized, and structural changes may be made without departing from the scope of the present invention.

Technical Description

The present invention applies the principle of coherent combining to the wavefunctions of a single particle or multiple particles. In various embodiments, control of the phase and/or amplitude of the quantum mechanical phase function is used to control various properties and/or spatial/temporal behavior of the particles (such as an electron).

The following examples, with reference to FIGS. 2-11, illustrate different exemplary embodiments of quantum phased array 400 comprising one or more arrays 401 of elements 402 each emitting one or more particles 404 having one or more quantum wavefunctions $\psi(\vec{r})$; one or more a quantum modulator elements 406 coupled to the elements 402, each of the modulator elements 406 comprising a source of a vector potential A(r) applying one or more phase shifts $\Delta\phi$ and/or amplitude shifts to the one or more quantum wavefunctions. A control circuit 601 can be coupled to the one or more phase shifting/modulator elements 406 to configure the one or more vector potentials to control an interference 408 of the quantum wavefunctions forming a distribution 409 of the one or more particles at a target 410, and wherein the distribution is described by a wavefunction interference pattern 412 resulting from the interference controlled by the vector potentials.

First Example: Quantum Phased Arrays Using Vector Potentials

FIGS. 2A-2B illustrate an embodiment utilizing the Ehrenberg-Siday-Aharonov-Bohm (ESAB) effect (aka Aharonov-Bohn or AB) to change or control the relative phase difference between elements 200 of an array 201 where electrons are emitted through multiple slots 202. The relative phase $\Delta\phi$ the of quantum mechanical wavefunction of two adjacent slots can be controlled by introducing a magnetic vector potential A in between the slots. The ESAB effect predicts that (even in the regions where the explicit magnetic field B may be zero) a non-zero vector potential can change the phase of the quantum mechanical wavefunction, thereby introducing a shift in the interference pattern. Using this experimentally verified principle, it is possible to introduce different phase shifts among the different elements to manipulate the wavefunction in different locations in space. FIG. 2 illustrates the phase shift $\Delta\Phi = \oint A \cdot dl$ over the triangular contour, where dl is an elemental length of the contour.

In the case of an array 300 multiple sources (e.g., multiple slits 302 as in FIG. 3), it is possible to create constructive interference 304 of the quantum wave function phase only in one direction. By introducing phase shifts between adjacent sources 302 (e.g., slits, or holes) it would be possible to create constructive interference in a certain direction in the far field, effectively inducing "beam forming" 306 in the pattern of the quantum probability. In this way, the wavefunction patterns in the far field can be manipulated in various fashions for various applications (where "beam forming" and "beam steering" are just a few examples).

In another embodiment, a 3-dimensional focal point may be created by controlling the relative phases of the elements. Similarly, other wavefunction manipulations may be performed to create different wave profiles suitable for a range of applications, including but not limited to, manipulation of various states including entangled states in quantum computing and communications.

Figure 4:
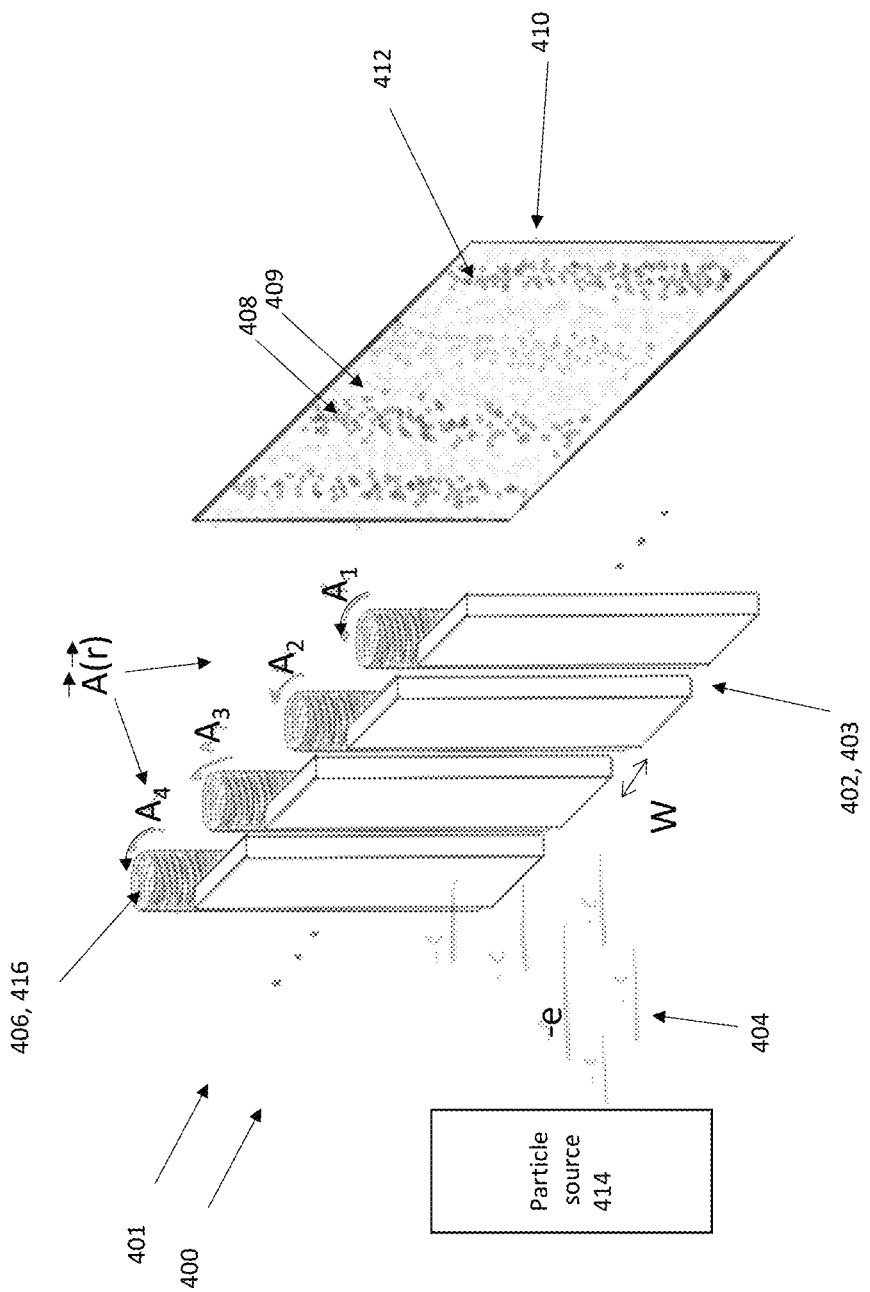
FIG. 4 illustrates an example wherein a particle source (such as an electron gun) is used to illuminate an array of slits where the local field potential is manipulated through solenoids.

FIG. 4 illustrates an example wherein a particle source 414 (such as an electron gun) is used to illuminate a one-dimensional array of slits 402 (alternatively a 2-dimensional array of small holes) where the local field potential is manipulated through the modulating element 406 comprising solenoid 416 or a toroid that can produce negligible (and in principle zero) external magnetic field B to avoid undesirable direct Lorentz force interactions, while changing the local (and through that the global) vector potential vector A(r) in various locations, defined by the position vector r. These can in turn introduce location-dependent phase manipulation of the quantum wave function, $\psi(\vec{r})$.

The phase arrangement can be changed by changing the electric current flowing through the individual coils (e.g., solenoids 416 or toroids) and can be used to produce large, complex, and dynamically manipulatable wave function patterns that would in turn result in a broad range of spatial probability of arrival for the particles 404 comprising electrons e⁻. This dynamic control of the probability of arrival can have applications in various additional areas such as displays (by creating the desired pattern of arrival of the particles by controlling the probability of the arrival).

Although FIGS. 2-3 illustrate quantum phased array embodiments utilizing an array of elements comprising slits or holes 403, more generally the array may comprise any elements 402 or structures or sources configured to emit, transmit, or source one or more particles 404 having one or more quantum wavefunctions.

Examples of emitter elements 402 include, but are not limited to windows, openings, holes (filled or empty), ports, or any other source or device or structure for emitting, channeling or diffracting the particles (or wavefronts associated with the particles via wave-particle duality) in a way that the quantum wavefunctions (or wavefronts associated with the particles) may subsequently interfere with each other. In one or more examples, the emitter elements 402 each comprise a diffracting element dimensioned to emit the particles by diffracting the one or more particles (or wavefronts associated with the particles) incident on the diffracting element, and the diffracting elements are spaced so as to form the interference (e.g., constructive and destructive) of the quantum wavefunctions or wavefronts associated with the one or more particles emitted from different ones of the emitter elements.

The elements 402 (e.g., holes) can have any shape, e.g., but not limited to, circular or square.

In various examples, the diffracting elements 403 each comprises an opening, through hole or other structure having a size (e.g., diameter or width W) commensurate with a de Broglie wavelength λ, of the particles 404 incident on the diffracting element. The de Broglie wavelength can be controlled by controlling the energy of the particles incident on the diffracting element. The dimensions of the diffracting element are therefore selected depending on the energy or velocities of the particles.

As an illustrative example, an electron having a velocity v=6×10⁶ m/s has a momentum p=mv=6×10⁻²⁴ kgm/s (assuming mass of the electron m~10⁻³⁰ kg). Using equation (4), the associated de Broglie wavelength λ for this electron is 1 micrometer. Thus, the diffractive elements (e.g., holes) should have a diameter of on the order of 1 micrometer (e.g., within a factor of 10) to effectively diffract the electron. However, the dimensions of the emitter or diffracting elements 403 can have any dimension commensurate with the de Broglie wavelength of the particles incident on the array, including but not limited, to slits or holes having a width W in a range of 1 nm-100 micrometer or 10 nm-10 micrometers, for example.

Furthermore, while FIGS. 3-4 illustrate phase shifting/modulator 406 elements comprising electrical coils 416, more generally the phase shifting/modulator element 406 can be any wavefunction modulating element capable of applying one or more phase and/or amplitude shifts to the one or more quantum wavefunctions. Example modulating elements comprise, but are not limited to, a source of a vector potential or other local property capable of modulating the phase or amplitude of the wavefunction.

Second Example: Multiple Layers

Figure 5:
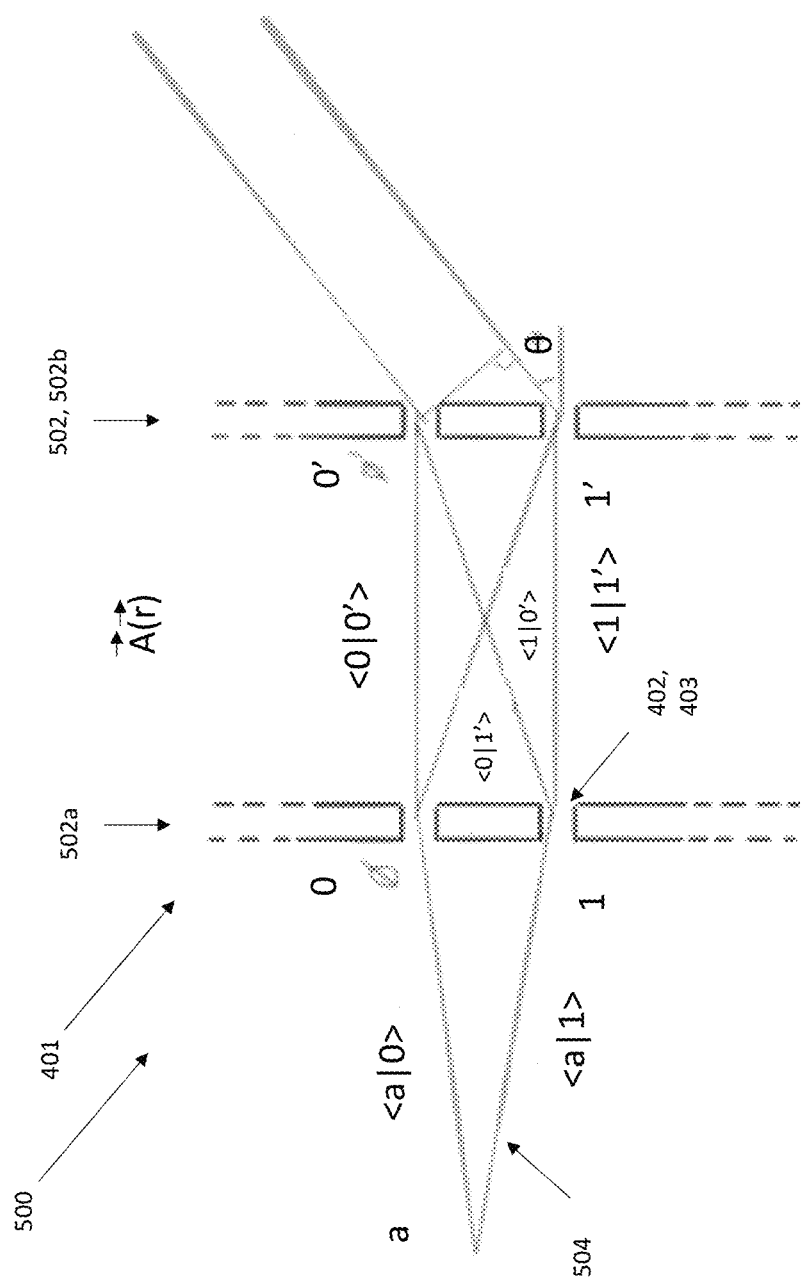
FIG. 5. Two-layer dual slit example of the more general multi-layer, multi-slit setting with magnetic vector potential control.

In one or more further examples, multiple layers of multiple slits (or multiple layers each comprising an array as described in the first example, for example) are used to produce even more complex phase relationships among different parts of the quantum wavefunction. FIG. 5 illustrates an example array 500 with two layers 502 of dual slits 403. As demonstrated by the calculations on pages 5-6 of the priority application Ser. No. 63218768, it is possible to provide additional degrees of freedom in the general behavior of the quantum mechanical wavefront.

In one or more examples, each layer 502a is coupled to another one of the layers 502b by a plurality of particle channels, paths, or trajectories 504 and each layer comprises an array 401 of input/output devices 402 (e.g., structures, pixels couplers, sources, ports, or nodes, holes 403 or slits, or diffracting elements) for inputting or coupling the particles 404 into the channels, paths or free-space trajectories 504. In one or more examples, the stack of layers form a quantum interferometer with a plurality of inputs 402, 406 controlling the interference of the quantum wavefunctions via the vector potential. In some examples, the modulating element 406 comprises a gate for coupling an input into the quantum wavefunctions.

Each layer 502 may include any number of elements 402 transmitting or emitting the particles. For example, each array layer may comprise between 1 and 1 million elements and an equal number of modulating elements. The number of layers in the stack is also not limited and may depend on the application. In some examples, there are between 1 and 100 layers, for example.

Third Example: Implementation with a Particle Detector, Computer and Feedback

Figure 6A:
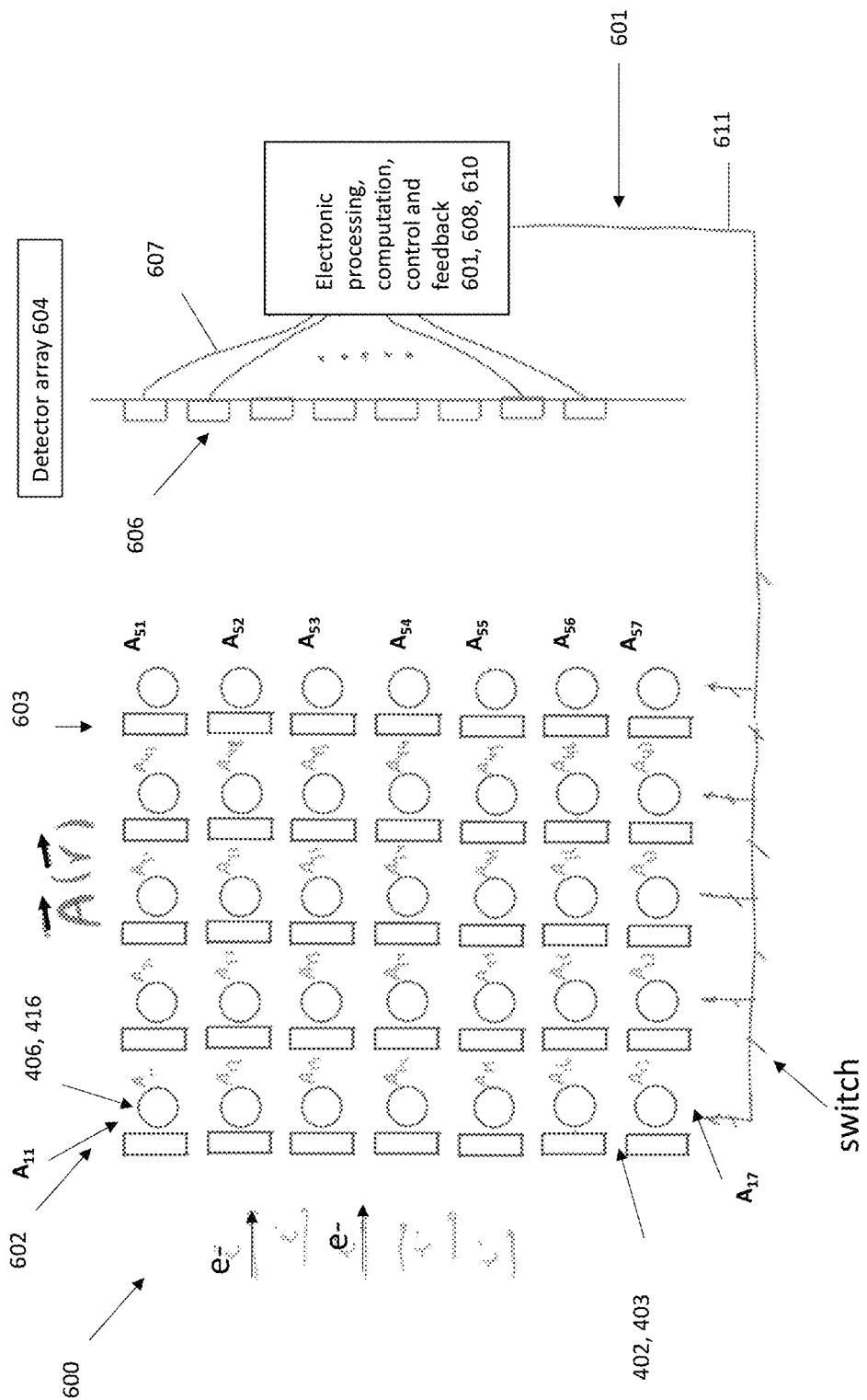
FIG. 6A. Example quantum phased array coupled to a computer for providing feedback.

FIG. 6A illustrates an example system 600 including the phased array 602 (e.g., as described in the first example or second example) illustrated in FIGS. 2-5) coupled to an array 604 of particle detector pixels 606 positioned at the target 410 and outputting one or more signals 607 in response to detection of the one or more particles 404 at the particle detector pixels 606; a collecting circuit 608 collecting and processing the signals 607 received from the detectors; and a computer 610 coupled to the array of particle detector pixels 606 and the control circuit 601, the computer performing one or more computations using the collected signals. The computer outputs one or more control signals 611 to the control circuit in response to the computations and the control circuit uses the one or more control signals as feedback to configure the vector potentials A(r).

In the embodiments where a closed loop system is formed between the classical electronic system 608, 610, 601 and the quantum array system 602, various complex functions and be implemented. Such as a system may enable combinatorial, sequential, and other complex quantum computation functions to be performed at very high speed and potentially at various range of temperatures (including, but not limited to, room temperature).

In one or more examples, the detector pixel array 604 comprises various kinds of detectors, including particle detectors and other detectors such avalanche photo diodes (APD), photomultiplier tubes (PMT), or PIN diodes arranged in one dimensional (1D), two dimensional (2D), or three dimensional (3D) arrays. These detectors can detect the pattern and statistics of arrival of the particles 404 used in the quantum phase array system 600.

Fourth Example: Implementation as a Quantum Computer

Figure 6B:
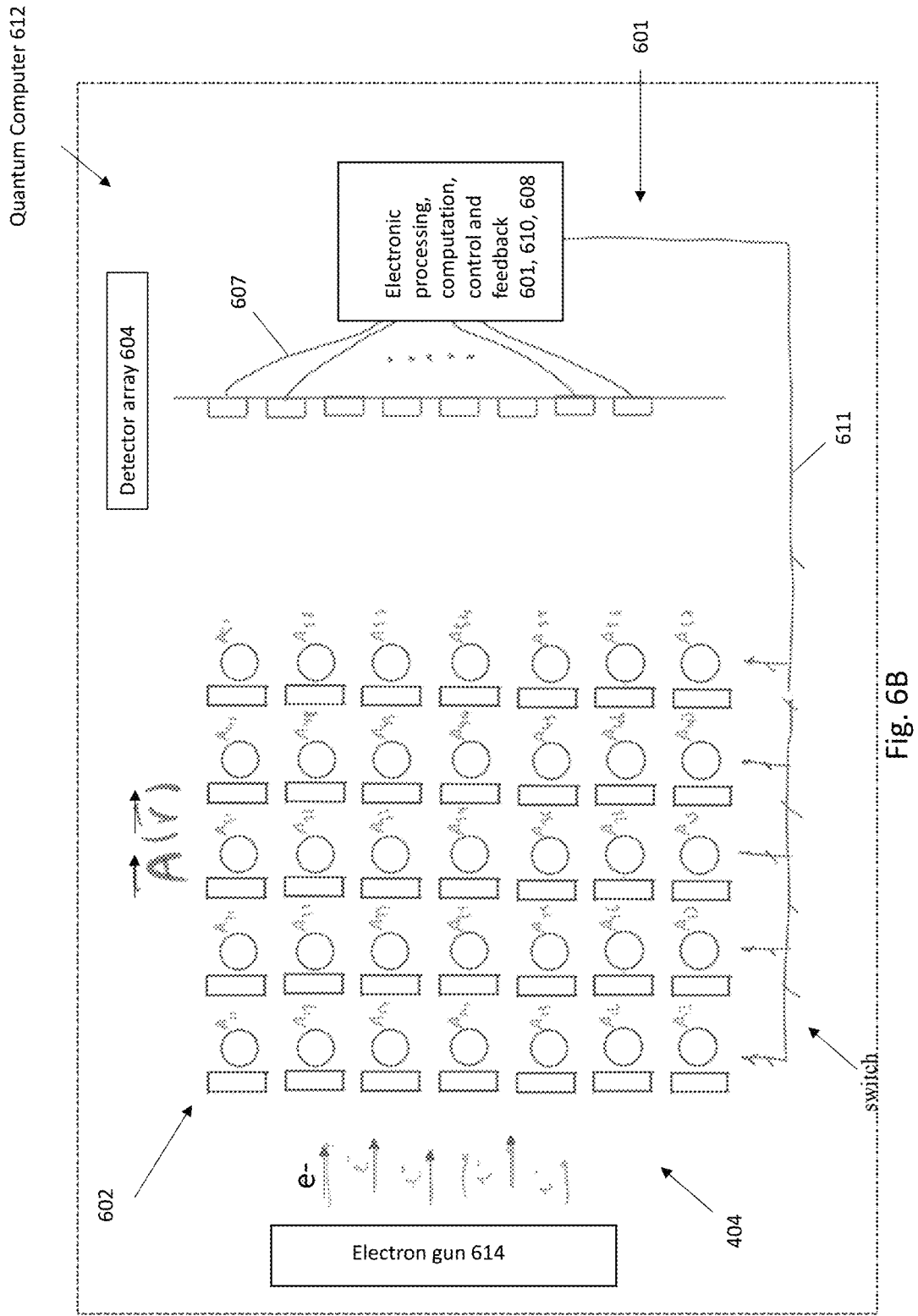
FIG. 6B. Example quantum computer comprising the quantum phased array.

FIG. 6B illustrates an example system comprising a quantum computer 612 comprising the phased array 602 (e.g., as described in the first example, second example or third example) coupled to a control system 601. The system further comprises a transmitter 614 (e.g., an electron gun) transmitting the one or more particles 404 to the phased array 602 with one or more energies, one or more timings, and one or more spatial and spin orientations. The quantum computer 612 performs a quantum algorithm using the collected signals, the timings, the control signals 611, and the energies as inputs or parameters and the detection signals 607 received from the detectors 606 as outputs or parameters.

In one or more examples, a single particle 404 (e.g., electron) is incident on the phased arrays and the interference results from interference of a single particle wavefunction. In this way, the negative effects of quantum decoherence on the implementation of the quantum computer are mitigated.

The transition state of the particles through each slot or hole 403 itself can establish a quantum bit (Qubit). In the case of a dual slit (two slits 403), this will be a two state Qubit which can be further modified and processed through the subsequent layers 502 and detection 604. When multiple slots 403 or elements 402 are present, each particle transition can establish an M-ary Qubit. For instance, M holes 403 or elements 402 would establish an M-ary Qubit. This M-ary state can be phase shifted through the change in the vector potential A(r) and then further observed through the arrival probability of the number of particles 404 on the detector 604 or the next layer 502b.

Figure 6C:
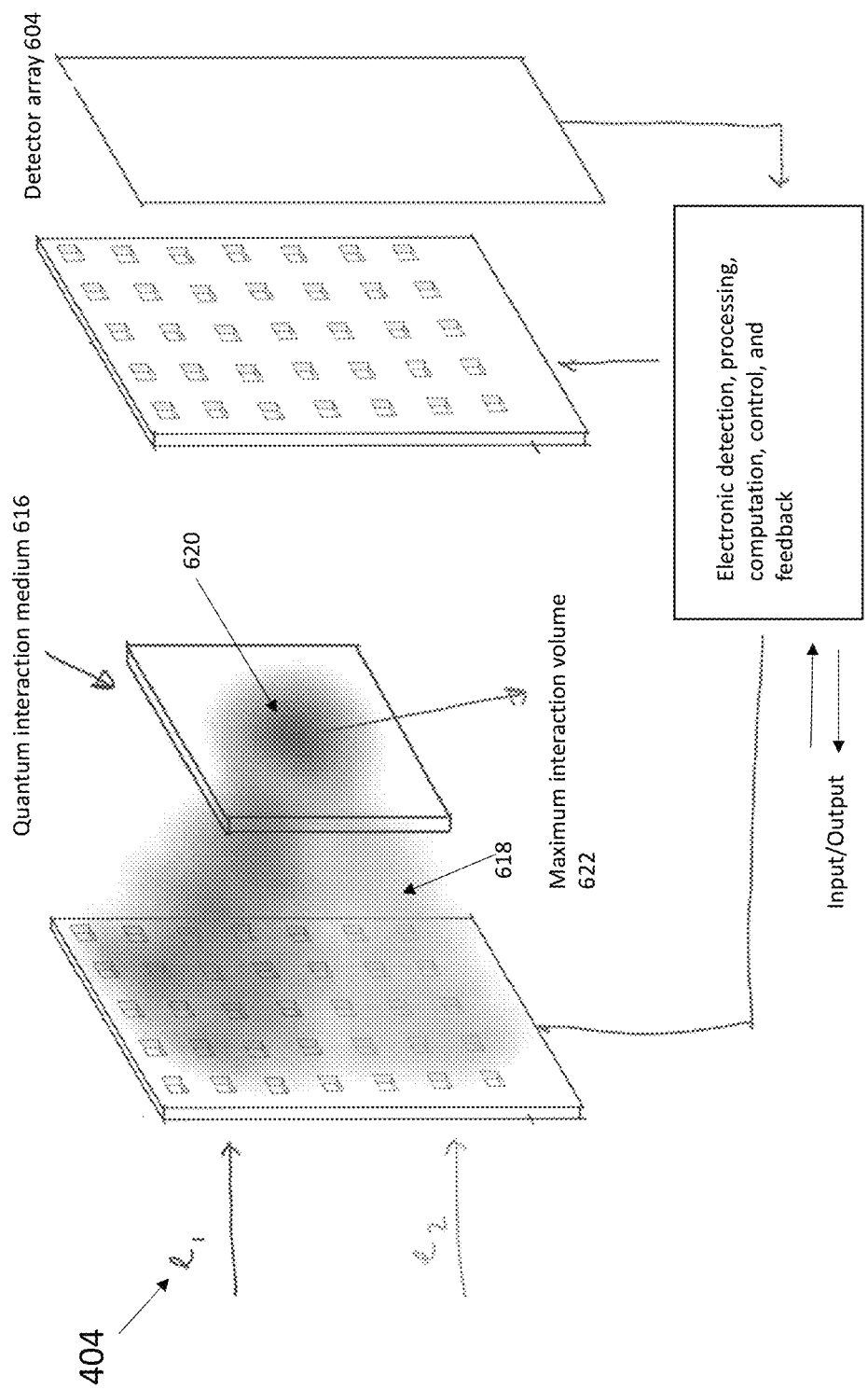
FIG. 6C illustrates the state of two particles transitioning together through the system, whose quantum wavefunctions are concentrated in the same spatial position and entangled via a non-linear electrodynamic interaction.

In some embodiments, there can be interlayer states to generate additional state entablements if necessary. For example, FIG. 6C illustrates the state of two particles 404 transitioning together through the system 600 can be entangled via a non-linear electrodynamic interaction where the electrostatic/dynamic repulsion or attraction of the particles can create additional entanglement of the state vectors of the individual particles. Additionally, in some other embodiments, magnetic spin/field and spin/spin interactions of the particles themselves can be used to modify and manipulate the entanglement among the particles. These interlayer interactions can be achieved through free-space or specifically designed electrically (or otherwise interacting) media 616 (such as dielectrics or dielectric porous material, or nonlinear materials such as Lithium-Niobate) or magnetic media 616 to achieve this additional interactions and mixing of the states. The level and nature of entanglement and the individual weights in the superposition of the states can, for instance, be controlled through the vector potential adjustment. For example, through vector potential adjustments, the quantum wavefunctions 618 of the two particles can be focused 620 in the same spatio-temporal coordinates (e.g., in a maximum interaction volume 622) to maximize their interactions and manipulate their state vectors accordingly.

These structures and arrays 602 allow for implementation of various quantum and semi-classical algorithms such as (but not limited to) Deutsch's algorithm, Deutsch-Jozsa algorithm, Simon's algorithm, and Shor's algorithm.

In the examples shown in FIGS. 6A-6B, the array 600 comprises multiple layers of arrays 603 of emitter elements and modulation elements enabling configuration of A11-A57 vector potentials in 5 columns and 7 rows, but any number or rows r and columns c is possible enabling individual control of, e.g., vector potentials A11-Acr.

Fifth Example: Implementation as a Quantum Metrology System

Figure 7:
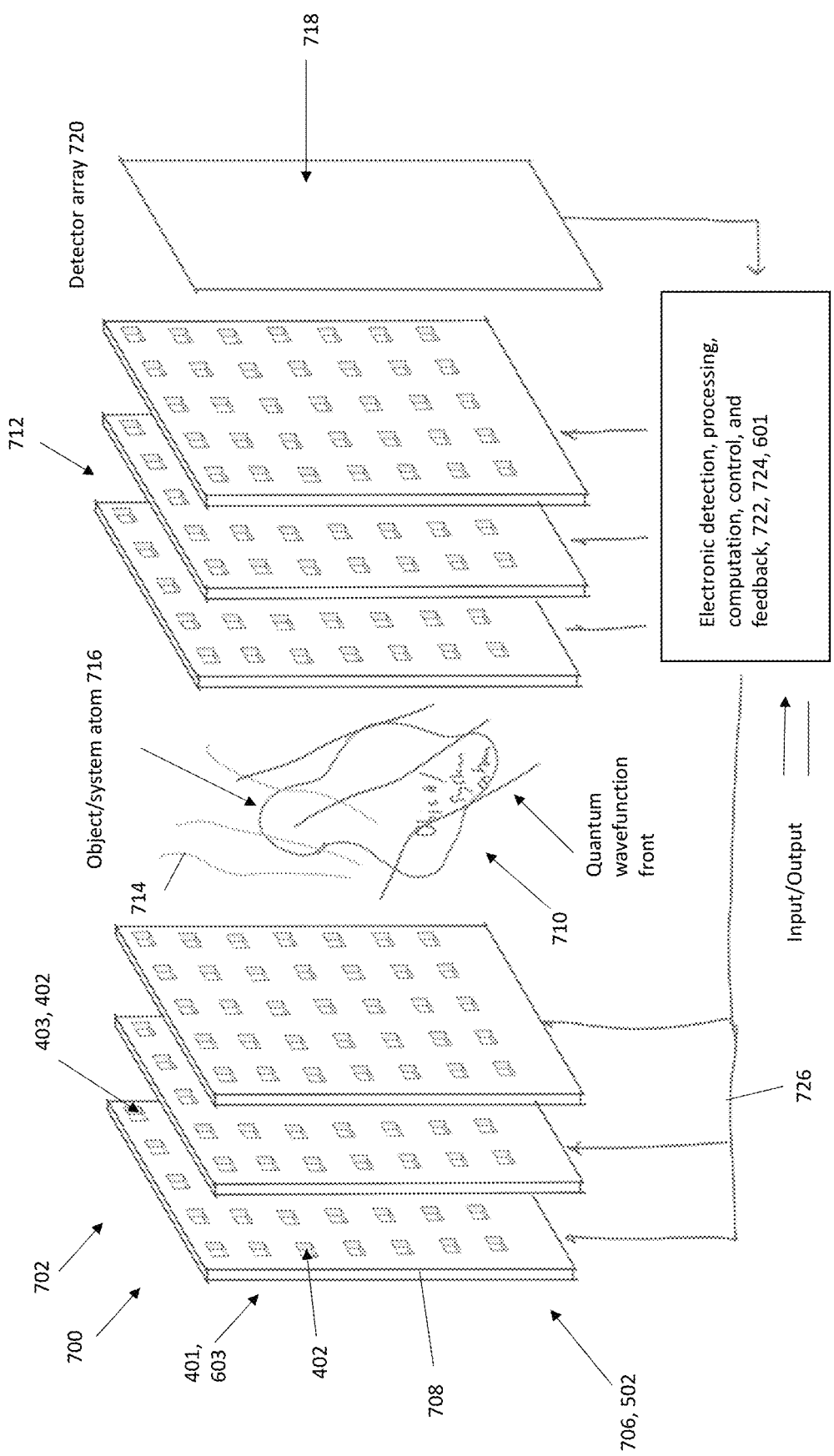
FIG. 7 illustrates a quantum transmission imaging system comprising the quantum phased array.
Figure 8:
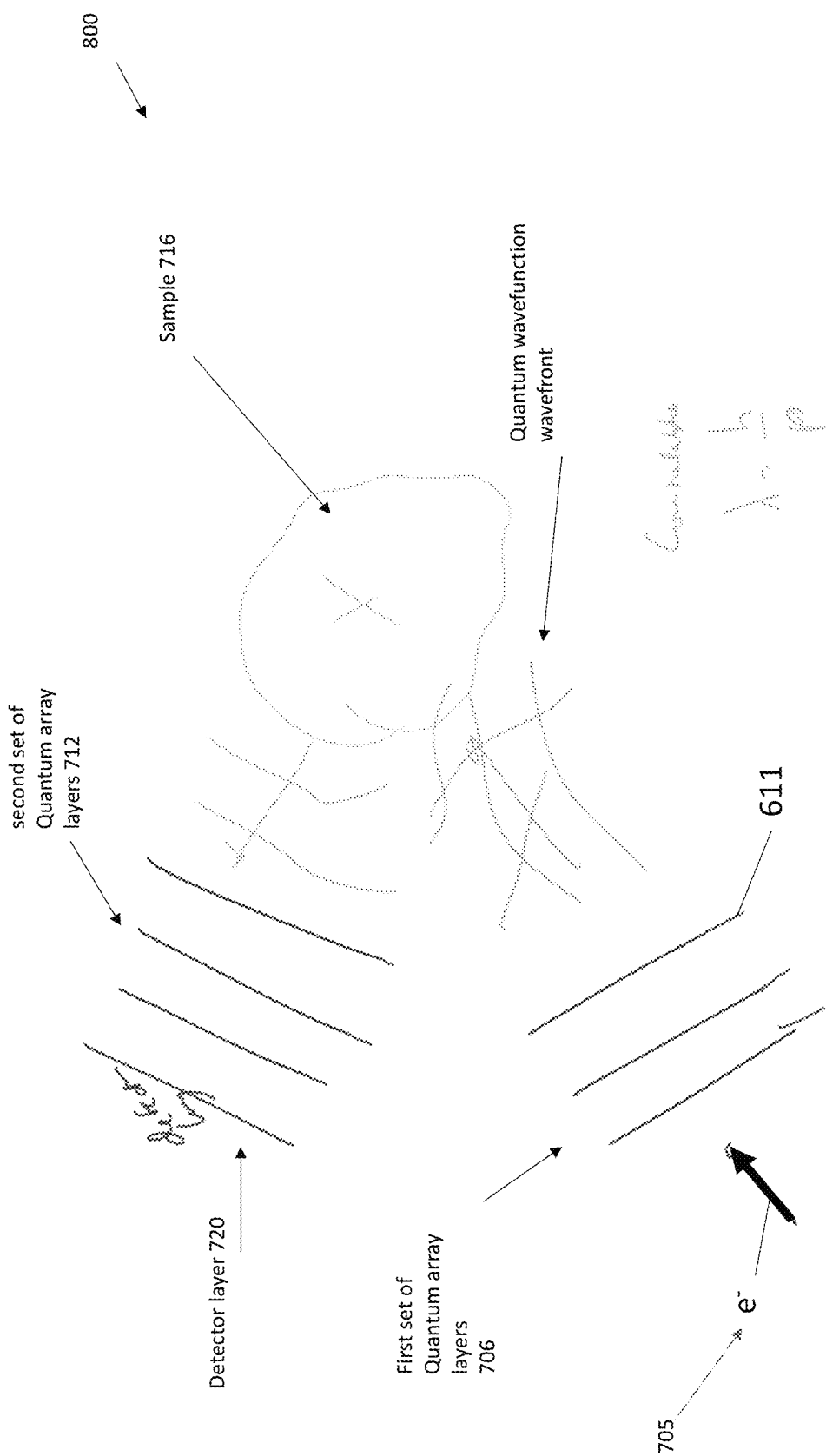
FIG. 8 illustrates a quantum scanning imaging system comprising the quantum phased array.
Figure 9:
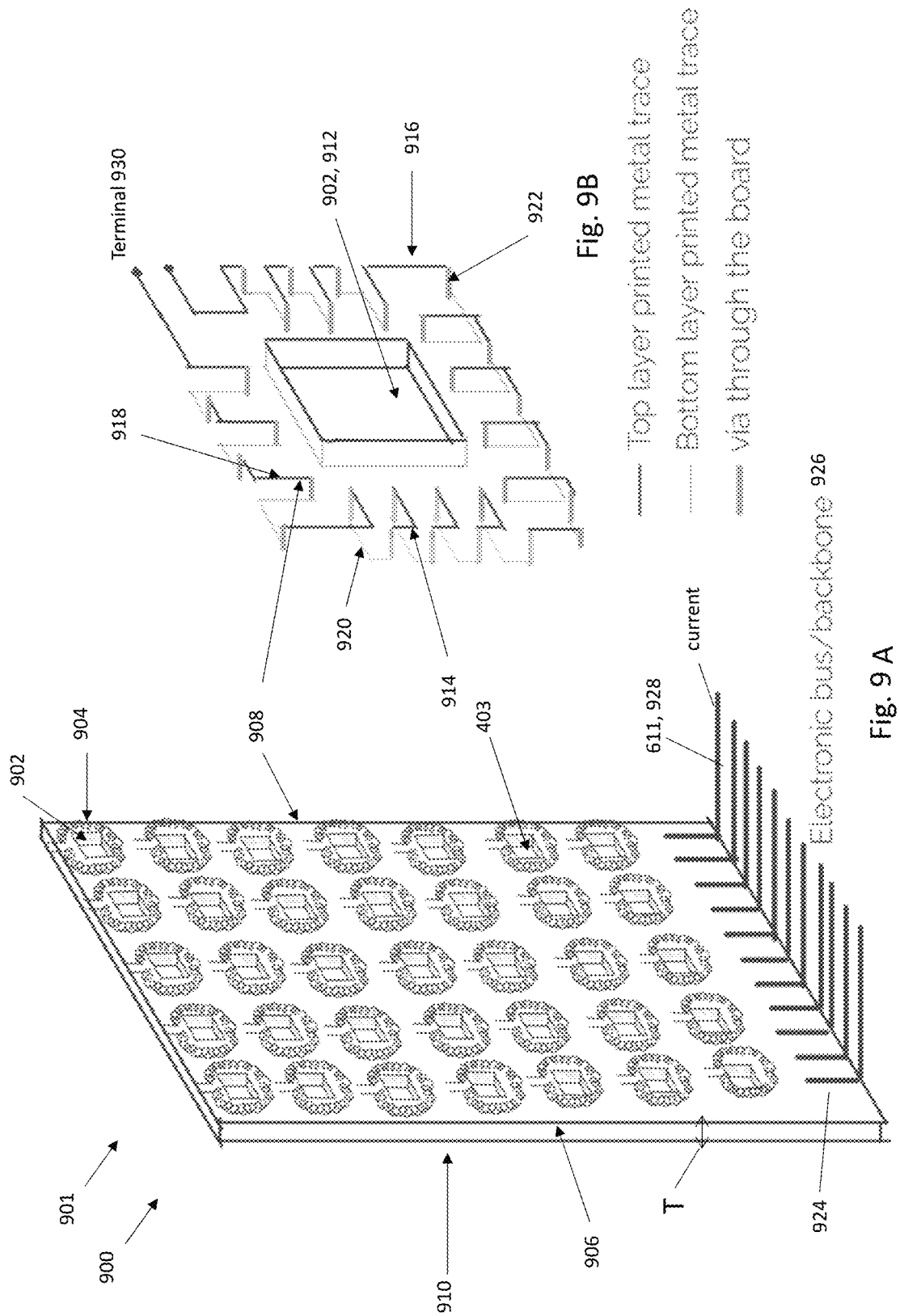
FIG. 9A illustrates a thin film printed circuit board comprising the array of emitter elements coupled to phase shifting elements and FIG. 9B is a close-up view of the an emitter element comprising a hole coupled to a toroid.

FIGS. 7 and 8 illustrate an example quantum detector or metrology system 700, 800 comprising the quantum phased array 702 (e.g. as described in any of the first example, second example, third example, fourth example and FIGS. 2-6A). The system 700 includes a transmitter 802 transmitting the one or more particles 404, 705 through the phased array 702 with one or more energies and one or more timings, a first set 706 of the one or more layers 708, 502 (e.g., as described in the second example) of the emitter elements 402 forming the distribution of the one or more particles 402 at the target comprising a first target 710; and a second set 712 of the one or more layers 708 of the emitter elements 402 positioned to receive the one or more particles 402, comprising one or more output particles 714 that have interacted with a sample 716 positioned at the first target 710, the second set forming the distribution of the output particles 714 at the target comprising a second target 718.

FIGS. 7-8 further illustrate a detection system 720 coupled to the second set 712, the detection system comprising an array of particle detector pixels 606 positioned at the second target 718 and outputting one or more signals 607 in response to detection of the one or more output particles 714 at the particle detector pixels 606. A collection circuit 722 coupled to the detector pixels collects the signals to form a collected signal.

At least one of a computer or a detection circuit 724 is coupled to the array of particle detector pixels. The computer or detection circuit uses the collected signal and optionally at least one of the timings or the energies to measure one or more quantum mechanical properties of the sample 716.

In one or more examples, the computer performs one or more computations using the collected signals and then outputs one or more control signals 726 to the control circuit 601 in at least the first set 706 or the second set 712 and in response to the computations. The control circuit uses the one or more control signals as feedback to configure the vector potentials A(r) for a measurement of the quantum mechanical properties. Example quantum mechanical properties include, but are not limited to, the quantum wavefront of the particles that have interacted with the sample, or the probability of a quantum level in the sample, which in turn can be used to measure or determine a crystalline structure of the sample, optical structure of the sample, or chemical structure of the sample (for example).

FIG. 7 illustrates an implementation wherein the quantum detector 700 is used in a transmission quantum imaging system (e.g., microscope) and FIG. 8 illustrates an implementation wherein the quantum detector is used in a scanning quantum imaging system 800.

Sixth Example: Implementation Using a Printed Circuit Board

FIG. 9A illustrates an example implementation of the quantum phased array of any of the first, second, third, fourth, or fifth examples, wherein each of the one or more layers 502 of elements comprises a thin-film printed circuit board 900. The elements 402 of the array 901 each comprise a through hole 902 in the printed circuit board and one of the modulator elements 406 each comprise an electrical printed circuit toroid coil 904 (or section of a toroid coil) coupled to the through hole.

FIG. 9A illustrates the printed circuit board comprises a dielectric material 906 (e.g., a semiconductor such as, but not limited to, silicon) between a first metallized surface 908 and a second metallized surface 910. FIG. 9B illustrates each toroid 904 is embedded in the dielectric material or integrated with the through-hole and the dielectric material between the first (front) metallized surface and the second (back) metallized surface, so that the hole 912 of each toroid comprises one of the through holes 902 in the printed circuit board and the region 914 inside the toroid (the core) comprises the dielectric material. In one or more examples, the axis of revolution of the toroid is coaxial with a center of the through-hole, parallel to a plane including the cross-sectional area of the through-hole and the coil weaves through the dielectric material so that the faces of the coils of the toroid have a diameter or width equal to, or along the direction of the thickness of the printed circuit board.

In the example of FIGS. 9A-9B, the electrical coil comprises a toroid comprising a conductive track 916 (e.g., metal trace) around a perimeter of the through hole and the conductive track comprises a plurality of first sections 918 of the first metallized surface; a plurality of second sections 920 of the second metallized surface; and electrical connections between the first sections and the second sections passing through vias 922 through a thickness T (less than 1 millimeter) of the dielectric material and positioned around the perimeter, so as to form the toroid 904 around the through hole and comprising the first sections, the second sections, and the electrical connections. Example metals for the metal trace include, but are not limited to, gold, silver or copper. The printed circuit board can have a thickness T of 1 millimeter or less than 1 millimeter, for example.

FIG. 9A further illustrates the printed circuit board comprises a plurality of pins 924 or connectors and tracks positioned for individually addressing each of the electrical coils and connecting to the control circuit via an electrical bus 926. The pins or connectors receive control signals 928, 611 from the control circuit for controlling the vector potentials by controlling a current through each of the electrical coils 904. Current flows through the toroid between terminals 930 connected to the pins 924. Each of the toroids can be individually addressed to control the vector potential experienced by the particles at each of the holes 902.

In other examples, the modulator elements each comprise an electrical solenoid positioned between two of the through-holes.

Possible Modifications and Variations

Many variants are possible for various quantum wavefront manipulation. These ideas are not limited to electrons and can be applied to other particles with varying properties (charge, spin, etc.).

The arrays and layers of array can be arranged in differential spatial and temporal arrangements. FIGS. 7 and 8 illustrate scanning and transmissive modes of operation, respectively.

This invention can also have significant applications in the field of electron microscopy where complex and arbitrary patterns of electrons can be projected on the target and the reflected electrons can be further manipulated to perform various complex functions (e.g., Fourier transform, spatial-temporal transforms, etc.) through the use of the arrays described herein.

In one or more examples, a computer may calculate a desired quantum wavefunction at the target and configure the vector potentials accordingly to achieve the desired wavefunction. In other examples, the quantum wavefunction evolves according to the execution of the quantum algorithm using the the vector potentials and detector signals as computation parameters.

Example Hardware Environment

Figure 10:
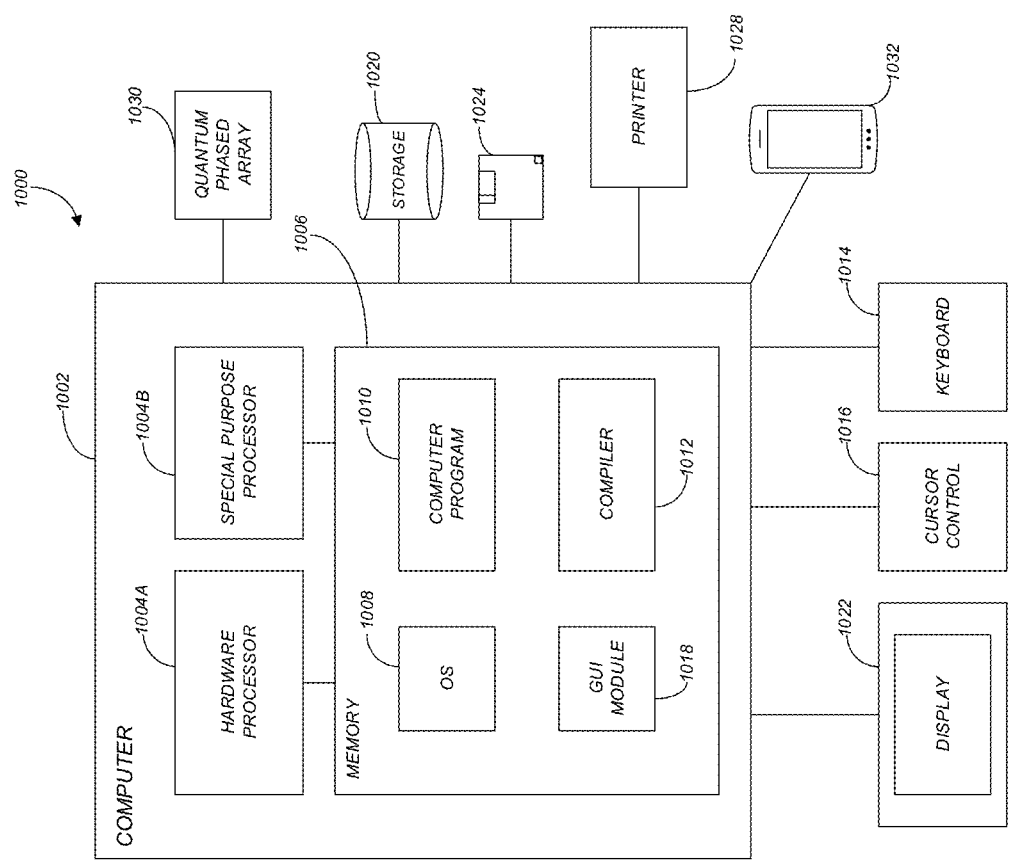
FIG. 10 illustrates an example hardware environment for controlling the quantum phased array.

FIG. 10 is an exemplary hardware and software environment 1000 (referred to as a computer-implemented system and/or computer-implemented method) used to implement one or more embodiments of the invention. The hardware and software environment includes a computer 1002 and may include peripherals. Computer 1002 may be a user/client computer, server computer, or may be a database computer. The computer 1002 comprises a hardware processor 1004A and/or a special purpose hardware processor 1004B (hereinafter alternatively collectively referred to as processor 1004) and a memory 1006, such as random access memory (RAM). The computer 1002 may be coupled to, and/or integrated with, other devices, including input/output (I/O) devices such as a keyboard 1014, a cursor control device 1016 (e.g., a mouse, a pointing device, pen and tablet, touch screen, multi-touch device, etc.) and a printer 1028. In yet another embodiment, the computer 1002 may comprise a multi-touch device, mobile phone, laptop, desktop, or other internet enabled device executing on various platforms and operating systems.

In one embodiment, the computer 1002 operates by the hardware processor 1004A performing instructions defined by the computer program 1010 under control of an operating system 1008. The computer program 1010 and/or the operating system 1008 may be stored in the memory 1006 and may interface with the user and/or other devices to accept input and commands and, based on such input and commands and the instructions defined by the computer program 1010 and operating system 1008, to provide output and results.

Output/results may be presented on the display 1022 or provided to another device for presentation or further processing or action. The image may be provided through a graphical user interface (GUI) module 1018. Although the GUI module 1018 is depicted as a separate module, the instructions performing the GUI functions can be resident or distributed in the operating system 1008, the computer program 1010, or implemented with special purpose memory and processors.

Some or all of the operations performed by the computer 1002 according to the computer program 1010 instructions may be implemented in a special purpose processor 1004B. In this embodiment, some or all of the computer program 1010 instructions may be implemented via firmware instructions stored in a read only memory (ROM), a programmable read only memory (PROM) or flash memory within the special purpose processor 1004B or in memory 1006. The special purpose processor 1004B may also be hardwired through circuit design to perform some or all of the operations to implement the present invention. Further, the special purpose processor 1004B may be a hybrid processor, which includes dedicated circuitry for performing a subset of functions, and other circuits for performing more general functions such as responding to computer program 1010 instructions. In one embodiment, the special purpose processor 1004B is an application specific integrated circuit (ASIC), field programmable gate array, or graphics processing unit.

The computer 1002 may also implement a compiler 1012 that allows an application or computer program 1010 written in a programming language such as C, C++, Assembly, SQL, PYTHON, PROLOG, MATLAB, or other language to be translated into processor 1004 readable code. Alternatively, the compiler 1012 may be an interpreter that executes instructions/source code directly, translates source code into an intermediate representation that is executed, or that executes stored precompiled code. Such source code may be written in a variety of programming languages such as JAVA, JAVASCRIPT, PERL, BASIC, etc. After completion, the application or computer program 1010 accesses and manipulates data accepted from I/O devices and stored in the memory 1006 of the computer 1002 using the relationships and logic that were generated using the compiler 1012.

The computer 1002 also optionally comprises an external communication device such as a modem, satellite link, Ethernet card, or other device for accepting input from, and providing output to, other computers 1002.

In one embodiment, instructions implementing the operating system 1008, the computer program 1010, and the compiler 1012 are tangibly embodied in a non-transitory computer-readable medium, e.g., data storage device 1020, which could include one or more fixed or removable data storage devices, such as a zip drive, floppy disc drive 1024, hard drive, CD-ROM drive, etc. Further, the operating system 1008 and the computer program 1010 are comprised of computer program 1010 instructions which, when accessed, read and executed by the computer 1002, cause the computer 1002 to perform the steps necessary to implement and/or use the present invention or to load the program of instructions into a memory 1006, thus creating a special purpose data structure causing the computer 1002 to operate as a specially programmed computer executing the method steps described herein. Computer program 1010 and/or operating instructions may also be tangibly embodied in memory 1006 and/or data communications devices 1030, thereby making a computer program product or article of manufacture according to the invention. As such, the terms "article of manufacture," "program storage device," and "computer program product," as used herein, are intended to encompass a computer program accessible from any computer readable device or media.

Of course, those skilled in the art will recognize that any combination of the above components, or any number of different components, peripherals, and other devices, may be used with the computer 1002.

Network Environment

Figure 11:
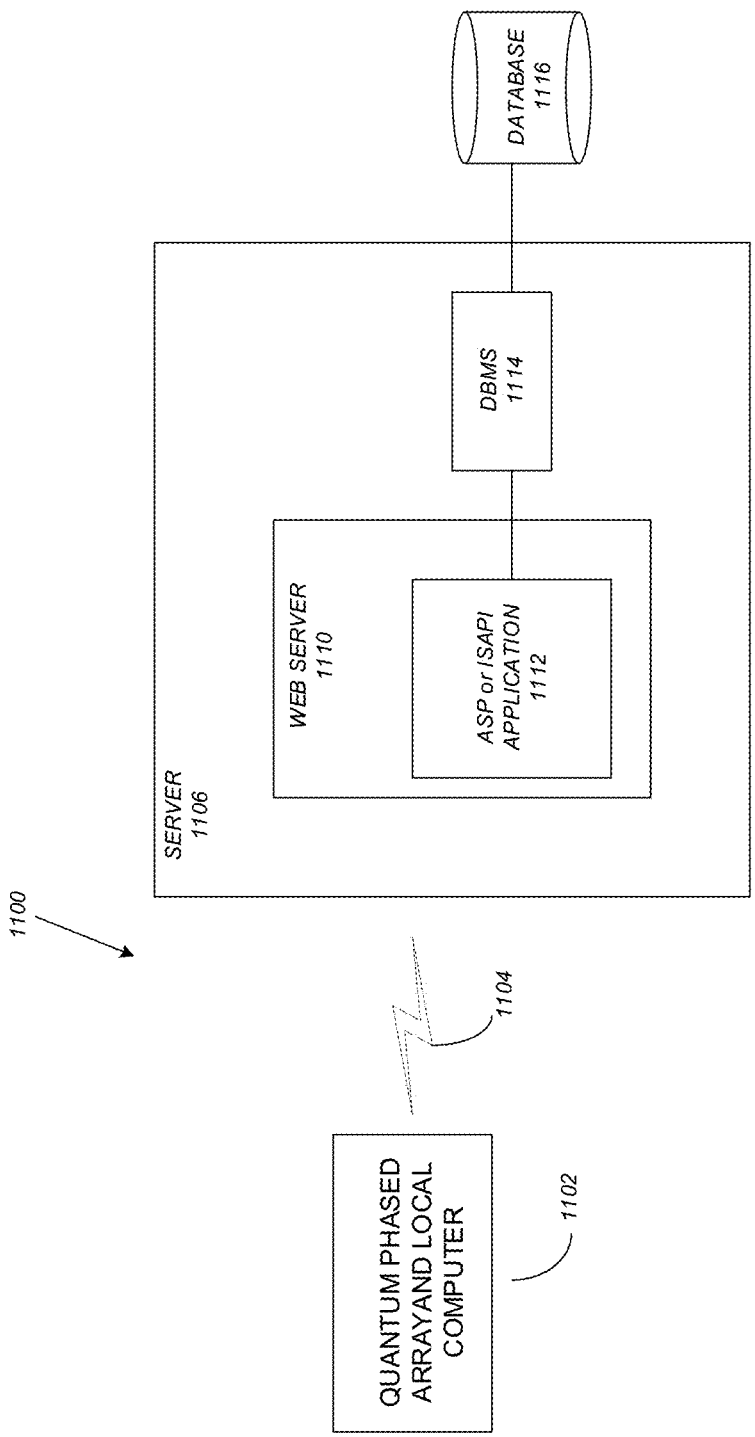
FIG. 11 illustrates an example network environment for controlling the quantum phased array.

FIG. 11 schematically illustrates a typical distributed/cloud-based computer system 1100 using a network 1104 to connect client computers 1102 to server computers 1106. A typical combination of resources may include a network

1104 comprising the Internet, LANs (local area networks), WANs (wide area networks), SNA (systems network architecture) networks, or the like, clients 1102 that are personal computers or workstations (as set forth in FIG. 10), and servers 1106 that are personal computers, workstations, minicomputers, or mainframes (as set forth in FIG. 10). However, it may be noted that different networks such as a cellular network (e.g., GSM [global system for mobile communications] or otherwise), a satellite based network, or any other type of network may be used to connect clients 1102 and servers 1106 in accordance with embodiments of the invention.

A network 1104 such as the Internet connects clients 1102 to server computers 1106. Network 1104 may utilize ethernet, coaxial cable, wireless communications, radio frequency (RF), optical fiber link, free space optical, etc. to connect and provide the communication between clients 1102 and servers 1106. Further, in a cloud-based computing system, resources (e.g., storage, processors, applications, memory, infrastructure, etc.) in clients 1102 and server computers 1106 may be shared by clients 1102, server computers 1106, and users across one or more networks. Resources may be shared by multiple users and can be dynamically reallocated per demand. In this regard, cloud computing may be referred to as a model for enabling access to a shared pool of configurable computing resources.

Clients 1102 may execute a client application or web browser and communicate with server computers 1106 executing web servers 1110. Web server 1110 may host an Active Server Page (ASP) or Internet Server Application Programming Interface (ISAPI) application 1112, which may be executing scripts. The scripts invoke objects that execute business logic (referred to as business objects). The business objects then manipulate data in database 1116 through a database management system (DBMS) 1114. Alternatively, database 1116 may be part of, or connected directly to, client 1102 instead of communicating/obtaining the information from database 1116 across network 1104. When a developer encapsulates the business functionality into objects, the system may be referred to as a component object model (COM) system. Accordingly, the scripts executing on web server 1110 (and/or application 1112) invoke COM objects that implement the business logic.

Generally, these components 1100-1116 all comprise logic and/or data that is embodied in/or retrievable from device, medium, signal, or carrier, e.g., a data storage device, a data communications device, a remote computer or device coupled to the computer via a network or via another data communications device, etc. Moreover, this logic and/or data, when read, executed, and/or interpreted, results in the steps necessary to implement and/or use the present invention being performed.

Although the terms "user computer", "client computer", and/or "server computer" are referred to herein, it is understood that such computers 1102 and 1106 may be interchangeable and may further include thin client devices with limited or full processing capabilities, portable devices such as cell phones, notebook computers, pocket computers, multi-touch devices, and/or any other devices with suitable processing, communication, and input/output capability.

Of course, those skilled in the art will recognize that any combination of the above components, or any number of different components, peripherals, and other devices, may be used with computers 1102 and 1106. Embodiments of the invention are implemented as a quantum phased array control on a client 1102 or server computer 1106. Further, as described above, the client 1102 or server computer 1106 may comprise a thin client device or a portable device that has a multi-touch-based display.

Example Process Steps

Figure 12:
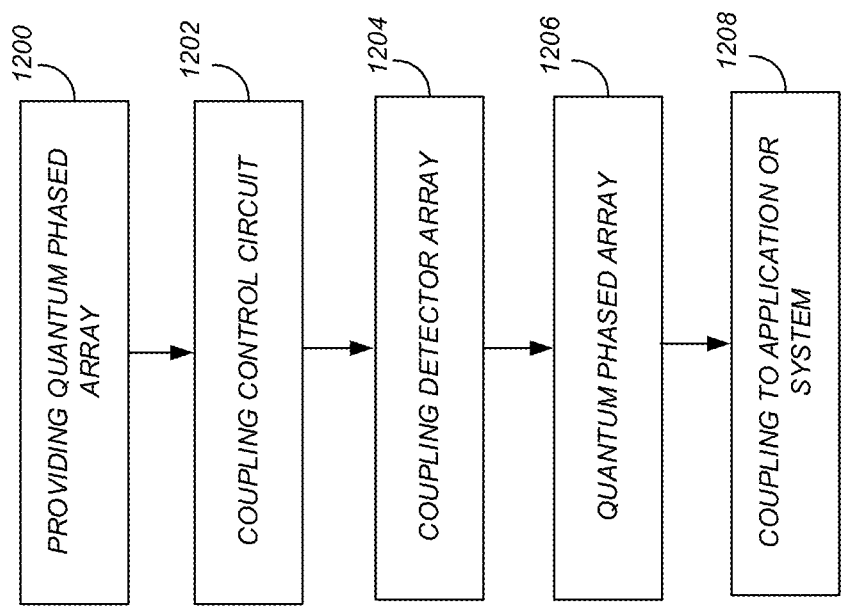
FIG. 12 is a flowchart illustrating an example method of making a quantum phased array.

FIG. 12 illustrates a method of making a quantum phased array.

Block 1200 represents forming or providing a quantum phased array, comprising:

one or more arrays of emitter elements each emitting one or more particles having one or more quantum wavefunctions;

one or more a modulator elements coupled to the emitter elements, each of the modulator elements comprising a source of a vector potential applying one or more phase and/or amplitude shifts to the one or more quantum wavefunctions; and Block 1202 represents coupling a control circuit to the one or more modulator elements, the control circuit configuring the one or more vector potentials (e.g., amplitude/magnitude and/or phase of the vector potentials) to control an interference of the quantum wavefunctions forming a distribution of the one or more particles at a target, and wherein the distribution is described by a wavefunction interference pattern resulting from the interference controlled by the vector potentials.

Block 1204 represents optionally coupling a particle detector.

Block 1206 represents the end result, a quantum phased array.

Block 1208 represents optional coupling of the phased array in a system.

Example devices, systems, and methods according to embodiments of the present invention include, but are not limited to, the following (referring also to FIGS. 1-11 as examples).

1. A quantum phased array 200, 300, 400, 500, 602, 702, 901 comprising:

one or more arrays of elements 402 each emitting one or more particles 404 having one or more quantum wavefunctions $\psi(\vec{r})$;

one or more a modulator elements 406 coupled to the elements, each of the modulator elements 406 comprising a source of a vector potential A applying at least one or more phase and/or amplitude shifts to the one or more quantum wavefunctions; and a control circuit 601, 1000 coupled to the one or more modulator elements 406, the control circuit configuring the one or more vector potentials A to control an interference 408 of the quantum wavefunctions forming a distribution of the one or more particles 404 at a target 410, and wherein the distribution is described by a wavefunction interference pattern 412 resulting from the interference (e.g., constructive and/or destructive interference of the wavefronts associated with the particles via wave particle duality) controlled by the vector potentials.

2. The quantum phased array of example 1, wherein the quantum phased arrays comprise one or more n layers 502 of the emitter elements 402 coupled and aligned such that the particles 404 outputted from the $j^{th}$ layer 502a are incident on the $(j+1)^{th}$ layer 502, where j and n are integers and $1 \leq j \leq n$.

3. The quantum phased array of example 1 or 2, further comprising:

an array of particle detector pixels 606 positioned at the target 410 and outputting one or more signals 607 in response to detection of the one or more particles 404 at the particle detector pixels 606;

a collecting circuit 608 collecting and processing the signals 607 received from the detector pixels 606 as collected signals; and a computer 1000, 610, 1004B coupled to the array of particle detector pixels 606 and the control circuit, the computer performing one or more computations using the collected signals; and wherein:

the computer outputs one or more control signals 611 to the control circuit 601 in response to the computations; and the control circuit 601 uses the one or more control signals 611 as feedback to configure the vector potentials.

4. A quantum computer 612 comprising the quantum phased array of any of the examples 1-3 and further comprising a transmitter 614 transmitting one or more particles 404 to the quantum phased array with one or more energies and one or more timings, wherein the quantum computer performs a quantum algorithm using at least one of the collected signals, the timings, the control signals 611, or the energies as inputs or parameters.

5. The quantum phased array of any of the examples 1-4, further comprising a plurality of layers 502 of the arrays 200, 300, 400 and a medium 616 between at least two of the layers 502, the medium (e.g., quantum interaction medium) mediating an interaction of the states of two particles $e_1$ and $e_2$ transitioning together through the quantum computer 616, wherein the control circuit 601 adjusts the vector potentials A so as to adjust at least one of a degree of superposition, entanglement or mixing of the states.

6. The quantum phased array of any of the examples 1-5, wherein adjustment of the vector potentials adjusts the quantum wavefunctions of the two particles so as to focus 620 the particles into the same spatio-temporal coordinates to maximize their interactions and manipulate their state vectors.

7. A quantum detector or metrology system 700, 800 comprising the quantum phased array 702 of any of the examples 1-6, and further comprising:

a transmitter 802 transmitting one or more particles 705 to the phased array with one or more energies and one or more timings and one or more spatial and spin orientations, a first set 706 of the one or more layers 502, 708 of the emitter elements 402 forming the distribution of the one or more particles 404 at the target comprising a first target 710;

a second set 712 of the one or more layers 708 of the emitter elements positioned to receive the one or more particles, comprising one or more output particles 714 that have interacted with a sample 716 positioned at the first target 710, the second set 712 forming the distribution of the output particles at the target comprising a second target 718; and a detection system 720 coupled to the second set, the detection system comprising:

an array of particle detector pixels 606 positioned at the second target and outputting one or more signals 607 in response to detection of the one or more output particles at the particle detector pixels;

a collection circuit 722 aggregating the signals to form one or many collected signal; and at least one of a computer 1000, 1004B or a detection circuit 724 coupled to the array of particle detector pixels 606, the computer or detection circuit using the aggregated signal and optionally at least one of the timings or the energies to measure one or more quantum mechanical properties of the sample 716.

8. The quantum detector of example 7, further comprising the computer performing one or more computations using the aggregated signal; and wherein:

the computer outputs one or more control signals 601 to the control circuit 601 in at least the first set 706 or the second set 712 and in response to the computations; and the control circuit 601 uses the one or more control signals 611 as feedback to configure the vector potentials A for a measurement of the quantum mechanical properties.

9. A scanning quantum imaging or transmission quantum imaging system 700, 800 comprising the quantum detector of example 7 or 8.

10. The quantum phased array of any of the examples 1-9, wherein each of the one or more layers 502, 901, 400 comprises a thin-film printed circuit board 900 comprising one of the arrays of the emitter elements 402 comprising a two dimensional array, the emitter elements each comprising a through hole 902 in the thin-film printed circuit board and one of the modulator elements 406 comprising an electrical coil 904 coupled to the through hole.

11. The quantum phased array of claim 10, wherein the printed circuit board comprises:

a dielectric material 906 between a first metallized surface 908 and a second metallized surface 910, and the electrical coil 904 comprises a toroid comprising a conductive track 916 around a perimeter of the through hole, the conductive track comprising:

a plurality of first sections 918 of the first metallized surface;

a plurality of second sections 920 of the second metallized surface;

electrical connections (comprising metal) between the first sections and the second sections passing through vias 922 through a thickness T of the dielectric material and positioned around the perimeter, so as to form the toroid around the through hole and comprising the first sections, the second sections, and the electrical connections.

12. The quantum phased array of example 10 or 11, wherein the printed circuit board comprises a plurality of pins 924 and tracks positioned for:

individually addressing each of the electrical coils and connecting to the control circuit 601 via an electrical bus 926, the pins receiving signals 621 (e.g., current) from the control circuit 601 for controlling the vector potentials by controlling a current through each of the electrical coils.

13. The quantum phased array of claim 1, wherein:

the elements 402 each comprise a diffracting element 403, 202, 302 dimensioned to emit the particles by diffracting the one or more particles 404 incident on the diffracting element, the diffracting elements 403 are spaced (d) so as to form the interference of the quantum wavefunctions associated with the one or more particles emitted from different ones of the emitter diffracting elements, and the modulator elements 406 are positioned between the diffracting elements.

14. The quantum phased array of example 13, wherein:

the diffracting element comprises an opening, slot 202, slit 302, or through hole 902 having a size (e.g., width W or diameter) commensurate with a de Broglie wavelength of the particles 404 incident on the diffracting element, and the de Broglie wavelength is determined from one or more energies of the particles 404 incident on the diffracting element.

15. The quantum phased array of any of the examples 1-14, wherein:

the particles 404 are charged particles, the modulator elements comprise electrical coils 904, 416 carrying a current configured so that a magnetic field B inside the coil is zero or sufficiently small so that trajectories of the charged particles are determined by the vector potentials A rather than deflection of the particles by the magnetic field, and a longitudinal axis of the coil is across a cross-section of the diffracting element so that the vector potential has a component in a direction across the diffracting element.

16. The quantum phased array of any of the examples 1-15, wherein the elements 402 are aligned and dimensioned, and the vector potentials are configured, so as to form at least one of a pre-determined spatial or temporal distribution of the particles at the target 410 associated with the wavefunction interference pattern.

17. The quantum phased array of any of the examples 1-16, wherein the elements are aligned and dimensioned, and the vector potentials are configured, so as to form the wavefunction interference pattern associated shaping a beam 306 of the particles incident on the target 410.

18. The quantum phased array of any of the examples 1-17, wherein the control circuit dynamically varies the vector potentials so as to steer a beam 306 of the particles 404.

19. The quantum phased array of any of the examples 1-18, wherein the emitter elements 402 are dimensioned and aligned, and the vector potentials are configured, so as to form the particles comprising entangled particles at the target.

20. An imaging system, detection system, communications system, or quantum computer comprising the phased array of any of the examples 1-19, wherein the particles comprise charged particles (e.g., electrons, protons, positrons), uncharged particles (e.g., neutrons), photons, phonons, or plasmons.

21. The quantum phased array of any of the examples 1-20, further comprising a detector array 720, 604 comprising a spatial array of detector pixels 606 coupled to the array of elements 402, wherein the detector pixels 606 each detect a probability of arrival of the one or more particles 404 (as a detection event per second, or number of detection events per second).

22. The quantum phased array of example 21, wherein the control circuit 601 changes or adjusts at least one of a magnitude or phase of the vector potentials A in response to read outs (e.g., signals 607) of the probabilities of the arrival received from the detector array 604, 720.

23. The quantum phased array of any of the examples, wherein the quantum mechanical wavefunction describes a charge distribution or spin distribution of the particles.

24. The quantum phased array of any of the examples 1-23, wherein:

the detector comprises an array of detectors or detector pixels 606 comprising avalanche photo diodes (APD), photomultiplier tubes (PMT), or PIN diodes arranged in 1D, 2D, or 3D arrays.

25. The quantum phased array of any of the examples, wherein the emitter elements comprise input/output devices 402, structures, pixels couplers, sources, ports, or nodes, holes 403 or slits, or diffracting elements for inputting or coupling the particles 404 into the channels, paths or free-space trajectories 504 e.g., connecting the layers and/or particle detectors.

26. The quantum phased array of any of the examples 1-25, wherein the vector potentials comprise a programmable vector field potential (without the need for a magnetic field in some examples). In some examples, B can be zero across the whole space and this can still work (since A can be non zero with a zero B).

27. The quantum phased array of any of the examples 1-26, wherein the detector array (comprising detector pixels) is mounted and aligned with the one or more layers of arrays on a rack or mount and optionally in a box or housing.

REFERENCES

The following references are incorporated by reference herein

1. A. Tonomura, et al., "Demonstration of single-electron buildup of an interference pattern," 1989.
2. A. Tonomura, et al., "Evidence for Aharonov-Bohm effect with magnetic field completely shielded from electron wave," PRL 1986.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A quantum phased array, comprising:
one or more arrays of emitter elements each emitting one or more particles having one or more quantum wavefunctions;
one or more modulator elements coupled to the emitter elements, each of the modulator elements comprising a source of a vector potential applying at least one of a phase shift or an amplitude shift to the one or more quantum wavefunctions; and
a control circuit coupled to the one or more modulator elements, the control circuit configuring the one or more vector potentials to control an interference of the one or more quantum wavefunctions forming a distribution of the one or more particles at a target, and wherein the distribution is described by a wavefunction interference pattern resulting from the interference controlled by the vector potentials.

2. The quantum phased array of claim 1, wherein the arrays comprise one or more n layers of the emitter elements coupled and aligned such that the one or more particles outputted from the $j^{th}$ layer are incident on the $(j+1)^{th}$ layer, where $1 \leq j \leq n$.

3. The quantum phased array of claim 2, further comprising:
- an array of particle detector pixels positioned at the target and outputting one or more signals in response to detection of the one or more particles at the particle detector pixels;
- a collecting circuit collecting and processing the signals received from the particle detector pixels to form one or more collected signals; and
- a computer coupled to the array of particle detector pixels and the control circuit, the computer performing one or more computations using the collected signals; and wherein:
- the computer outputs one or more control signals to the control circuit in response to the computations; and
- the control circuit uses the one or more control signals as feedback to configure the vector potentials.

4. A quantum computer comprising the quantum phased array of claim 3 and further comprising a transmitter transmitting the one or more particles to the quantum phased array with one or more energies and one or more timings, wherein the quantum computer performs a quantum algorithm using the collected signals, the timings, the control signals, and the energies as inputs and/or parameters.

5. The quantum phased array of claim 2, further comprising a plurality of layers of the arrays of the emitter elements and a medium between at least two of the layers, the medium mediating an interaction of the states of two of the particles transitioning together through the quantum phased array, wherein the control circuit adjusts the vector potentials so as to adjust at least one of a degree of superposition, entanglement, or mixing of the states.

6. The quantum phased array of claim 2, wherein an adjustment of the one or more vector potentials adjusts the quantum wavefunctions of two of the particles so as to focus the two of the particles into the same spatio-temporal coordinates to maximize interactions of the two of the particles and manipulate the state vectors of the two of the particles.

7. A quantum detector or metrology system comprising the quantum phased array of claim 2, and further comprising:
- a transmitter transmitting the one or more particles to the quantum phased array with one or more energies and one or more timings and one or more spatial and spin orientations,
- a first set of the one or more layers of the emitter elements forming the distribution of the one or more particles at the target comprising a first target;
- a second set of the one or more layers of the emitter elements positioned to receive the one or more particles, comprising one or more output particles that have interacted with a sample positioned at the first target, the second set forming the distribution of the output particles at the target comprising a second target;
- a detection system coupled to the second set, the detection system comprising:
- an array of particle detector pixels positioned at the second target and outputting one or more signals in response to detection of the one or more output particles at the particle detector pixels;
- a collection circuit aggregating or collecting the signals to form one or more collected signals; and
- at least one of a computer or a detection circuit coupled to the array of particle detector pixels, the computer or detection circuit using the one or more collected signals and at least one of the timings or the energies to measure one or more quantum mechanical properties of the sample.

8. The quantum detector of claim 7, further comprising the computer performing one or more computations using the one or more collected signals; and wherein:
- the computer outputs one or more control signals to the control circuit in at least the first set or the second set and in response to the computations; and
- the control circuit uses the one or more control signals as feedback to configure the one or more vector potentials for a measurement of the quantum mechanical properties.

9. A scanning quantum imaging system or transmission quantum imaging system comprising the quantum detector of claim 7.

10. The quantum phased array of claim 2, wherein each of the one or more layers comprises a thin-film printed circuit board comprising one of the arrays of the emitter elements comprising a two dimensional array, the emitter elements each comprising a through hole in the thin-film printed circuit board and one of the modulator elements comprising an electrical coil coupled to the through hole.

11. The quantum phased array of claim 10, wherein the printed circuit board comprises:
- a dielectric material between a first metallized surface and a second metallized surface, and
- the electrical coil comprises a toroid comprising a conductive track around a perimeter of the through hole, the conductive track comprising:
- a plurality of first sections of the first metallized surface;
- a plurality of second sections of the second metallized surface;
- electrical connections between the first sections and the second sections passing through vias through a thickness of the dielectric material and positioned around the perimeter, so as to form the toroid around the through hole and comprising the first sections, the second sections, and the electrical connections.

12. The quantum phased array of claim 11, wherein the printed circuit board comprises a plurality of pins and tracks positioned for:
- individually addressing each of the electrical coils and connecting to the control circuit via an electrical bus, the pins receiving signals and/or current from the control circuit for controlling the vector potentials by controlling the current through each of the electrical coils.

13. The quantum phased array of claim 1, wherein:
- the emitter elements each comprise a diffracting element dimensioned to emit the one or more particles by diffracting the one or more particles incident on the diffracting element,
- the diffracting elements are spaced so as to form the interference of the quantum wavefunctions associated with the one or more particles emitted from different ones of the diffracting elements, and
- the modulator elements are positioned between the diffracting elements.

14. The quantum phased array of claim 13, wherein:
- the diffracting element comprises an opening, slot, slit, or through hole having a size commensurate with a de Broglie wavelength of the one or more particles incident on the opening,
- and the de Broglie wavelength is determined from one or more energies of the particles incident on the diffracting element.

15. The quantum phased array of claim 14, wherein:
the particles are charged particles, and
the modulator elements comprise electrical coils carrying a current configured so that a magnetic field inside the coil is zero or sufficiently small so that trajectories of the charged particles are determined by the vector potentials rather than deflection of the particles by the magnetic field.

16. The quantum phased array of claim 2, wherein the emitter elements are aligned and dimensioned, and the vector potentials are configured, so as to form at least one of a pre-determined spatial or temporal distribution of the one or more particles at the target associated with the wavefunction interference pattern.

17. The quantum phased array of claim 2, wherein the emitter elements are aligned and dimensioned, and the vector potentials are configured, so as to form the wavefunction interference pattern associated shaping a beam of the one or more particles incident on the target.

18. The quantum phased array of claim 2, wherein the control circuit dynamically varies the one or more vector potentials so as to steer a beam of the particles.

19. The quantum phased array of claim 2, wherein the emitter elements are dimensioned and aligned, and the one or more vector potentials are configured, so as to form the particles comprising entangled particles at the target.

20. The quantum phased array of claim 1, further comprising:
a detector array comprising a spatial array of detector pixels coupled to the array of emitter elements, wherein the detector pixels each detect a probability of arrival of the one or more particles at the detector pixels.

21. The quantum phased array of claim 20, wherein the control circuit changes or adjusts at least one of an amplitude or a phase of the vector potentials in response to read outs of the one or more probabilities of the arrival received from the detector array.

* * * * *